(12) United States Patent
Wang et al.

(10) Patent No.: US 9,853,021 B1
(45) Date of Patent: Dec. 26, 2017

(54) SEMICONDUCTOR DEVICE AND METHOD FOR FABRICATING THE SAME

(71) Applicant: UNITED MICROELECTRONICS CORP., Hsin-Chu (TW)

(72) Inventors: Kuan-Ti Wang, Kaohsiung (TW); Ling-Chun Chou, Yun-Lin County (TW); Kun-Hsien Lee, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/614,624

(22) Filed: Jun. 6, 2017

(30) Foreign Application Priority Data

May 5, 2017 (TW) .............................. 106114874 A

(51) Int. Cl.
| | | |
|---|---|---|
| *H01L 29/49* | (2006.01) | |
| *H01L 27/06* | (2006.01) | |
| *H01L 21/8238* | (2006.01) | |
| *H01L 29/78* | (2006.01) | |
| *H01L 29/66* | (2006.01) | |
| *H01L 21/8234* | (2006.01) | |
| *H01L 29/423* | (2006.01) | |

(52) U.S. Cl.
CPC .... *H01L 27/0617* (2013.01); *H01L 21/82385* (2013.01); *H01L 21/823821* (2013.01); *H01L 21/823842* (2013.01); *H01L 21/823864* (2013.01); *H01L 21/823878* (2013.01); *H01L 21/82345* (2013.01); *H01L 29/4236* (2013.01); *H01L 29/66621* (2013.01); *H01L 29/785* (2013.01); *H01L 29/7816* (2013.01)

(58) Field of Classification Search
CPC ....... H01L 21/82345; H01L 21/823878; H01L 29/4236; H01L 29/4983; H01L 29/66621
USPC .................................. 257/407; 438/286, 592
See application file for complete search history.

(56) References Cited

U.S. PATENT DOCUMENTS

| | | | | |
|---|---|---|---|---|
| 8,378,428 B2 * | 2/2013 | Chew | ............... | H01L 21/28079 |
| | | | | 257/388 |
| 8,643,121 B2 * | 2/2014 | Mueller | ............ | H01L 21/26586 |
| | | | | 257/407 |
| 8,735,983 B2 * | 5/2014 | Liu | ..................... | H01L 29/4983 |
| | | | | 257/344 |
| 8,748,271 B2 | 6/2014 | Toh et al. | | |
| 9,034,711 B2 | 5/2015 | Toh et al. | | |
| 2003/0116781 A1 * | 6/2003 | Ohuchi | ............... | H01L 21/2807 |
| | | | | 257/151 |
| 2003/0178689 A1 * | 9/2003 | Maszara | ............ | H01L 21/0337 |
| | | | | 257/407 |
| 2005/0145959 A1 * | 7/2005 | Forbes | .............. | H01L 21/28105 |
| | | | | 257/412 |

(Continued)

OTHER PUBLICATIONS

Lin, Title of Invention: FinFET Structure Device, U.S. Appl. No. 15/064,618, filed Mar. 9, 2016.

*Primary Examiner* — George Fourson, III
(74) *Attorney, Agent, or Firm* — Winston Hsu

(57) ABSTRACT

A method for fabricating semiconductor device includes the steps of: forming a first fin-shaped structure on a substrate; forming a shallow trench isolation (STI) adjacent to the first fin-shaped structure; and forming a gate structure on the first fin-shaped structure and the STI. Preferably, the gate structure comprises a left portion and the right portion and the work functions in the left portion and the right portion are different.

16 Claims, 4 Drawing Sheets

(56) References Cited

U.S. PATENT DOCUMENTS

| | | | |
|---|---|---|---|
| 2006/0244079 A1* | 11/2006 | Wang | H01L 21/845 |
| | | | 257/407 |
| 2008/0128767 A1* | 6/2008 | Adkisson | H01L 27/14609 |
| | | | 257/292 |
| 2008/0277743 A1* | 11/2008 | Cho | H01L 21/28114 |
| | | | 257/407 |
| 2009/0180010 A1* | 7/2009 | Adkisson | H01L 31/103 |
| | | | 348/294 |
| 2010/0041225 A1* | 2/2010 | Anderson | H01L 21/28105 |
| | | | 438/592 |
| 2015/0380520 A1* | 12/2015 | Colinge | H01L 29/66545 |
| | | | 257/407 |
| 2017/0207312 A1* | 7/2017 | Jan | H01L 29/42376 |

\* cited by examiner

US 9,853,021 B1

SEMICONDUCTOR DEVICE AND METHOD FOR FABRICATING THE SAME

BACKGROUND OF THE INVENTION

1. Field of the Invention

The invention relates to a method for fabricating semiconductor device, and more particularly, to a method of integrating lateral double-diffused metal-oxide-semiconductor (LDMOS) device with fin-shaped structures.

2. Description of the Prior Art

Having the advantages of a high operational bandwidth, a high operational efficiency, and a planar structure that eases the integration in other integrated circuits, lateral double-diffused metal-oxide-semiconductor (LDMOS) transistor devices are widely used in high operational voltage environments such as CPU power supplies, power management systems, AC/DC converters, and high-power or high frequency (HF) band power amplifiers.

With the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the fin FET can be controlled by adjusting the work function of the gate.

However, the design of fin-shaped structure in current FinFET fabrication still resides numerous bottlenecks which induces current leakage of the device and affects overall performance of the device. Hence, how to improve the current FinFET fabrication and structure has become an important task in this field.

SUMMARY OF THE INVENTION

According to an embodiment of the present invention, a method for fabricating semiconductor device includes the steps of: forming a first fin-shaped structure on a substrate; forming a shallow trench isolation (STI) adjacent to the first fin-shaped structure; and forming a gate structure on the first fin-shaped structure and the STI. Preferably, the gate structure comprises a left portion and the right portion and the work functions in the left portion and the right portion are different.

According to another aspect of the present invention, a semiconductor device includes: a first fin-shaped structure on a substrate; a shallow trench isolation (STI) adjacent to the first fin-shaped structure; and a gate structure on the first fin-shaped structure and the STI. Preferably, the gate structure comprises a left portion and the right portion and the work functions in the left portion and the right portion are different.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
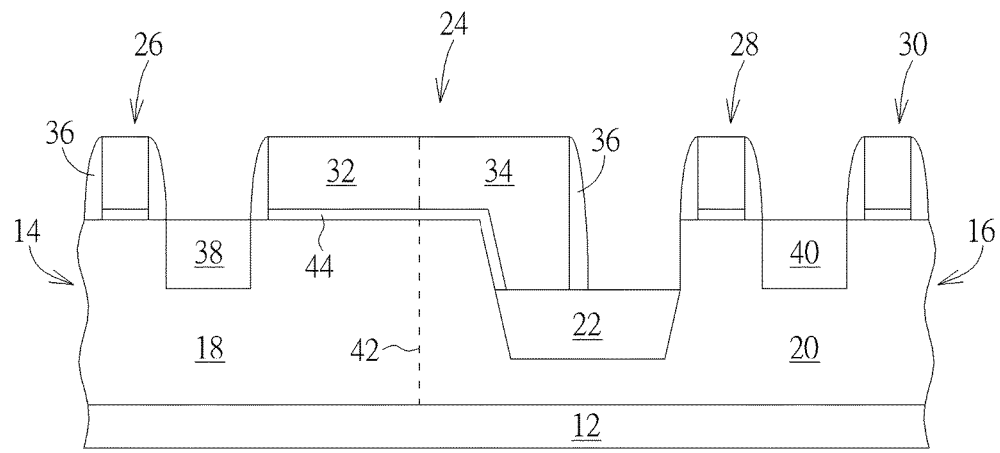
FIG. 1 illustrates a method for fabricating a LDMOS device according to an embodiment of the present invention.

Referring to FIG. 1, FIG. 1 illustrates a method for fabricating a LDMOS device according to an embodiment of the present invention. As shown in FIG. 1, a substrate 12 is first provided, a first fin-shaped structure 14 and a second fin-shaped structure 16 are formed on the substrate 12, a first well (such as p-well 18) and a second well (such as n-well 20) are formed in the first fin-shaped structure 14 and the second fin-shaped structure 16, and a shallow trench isolation (STI) 22 is formed between the first fin-shaped structure 14 and the second fin-shaped structure 16. Preferably, the top surface of the STI 22 is slightly lower than the top surface of the first fin-shaped structure 14 and the second fin-shaped structure 16, the first well (such as p-well 18) is completely disposed within the first fin-shaped structure 14, the second well (such as n-well 20) is disposed in both the second fin-shaped structure 16 and first fin-shaped structure 14, and the STI 22 is also disposed in or surrounded by the second well (such as n-well 20) completely.

In this embodiment, the substrate 12 could be a semiconductor substrate such as a silicon substrate, an epitaxial substrate, a SiC substrate, or a silicon-on-insulator (SOI) substrate and the shallow trench isolation (STI) 22 is preferably made of silicon oxide, but not limited thereto.

According to an embodiment of the present invention, the first fin-shaped structure 14 and the second fin-shaped structure 16 could be obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the substrate underneath, and through additional fin cut processes, desirable pattern structures, such as stripe patterned fin-shaped structures could be obtained.

Alternatively, the fin-shaped structures could also be obtained by first forming a patterned mask (not shown) on the substrate 12, and through an etching process, the pattern of the patterned mask is transferred to the substrate 12 to form the first fin-shaped structure 14 and the second fin-shaped structure 16. Moreover, the formation of the fin-shaped structures could also be accomplished by first forming a patterned hard mask (not shown) on the substrate 12, and a semiconductor layer composed of silicon germanium is grown from the substrate 12 through exposed patterned hard mask via selective epitaxial growth process to form the corresponding first fin-shaped structure 14 and second fin-shaped structure 16. These approaches for forming fin-shaped structures are all within the scope of the present invention.

Next, a gate structure 24 is formed on the first fin-shaped structure 14 and the STI 22, a gate structure 26 is formed on the first fin-shaped structure 14 on the left side of the gate structure 24, and a gate structure 28 and gate structure 30 are formed on the second fin-shaped structure 16. Preferably, the gate structure 24 disposed on both the first fin-shaped structure 14 and the STI 22 includes a left portion 32 and a right portion 34 while the work functions in the left portion 32 and the right portion 34 are different.

In this embodiment, the formation of the gate structures 24, 26, 28, 30 could be accomplished by a gate first process, a high-k first approach from gate last process, or a high-k last approach from gate last process. Since this embodiment pertains to a high-k last approach, a gate dielectric layer or interfacial layer, a gate material layer, and a selective hard mask could be formed sequentially on the substrate 12, and a pattern transfer process is then conducted by using a patterned resist (not shown) as mask to remove part of the gate material layer and part of the gate dielectric layer through single or multiple etching processes. After stripping the patterned resist, gate structures 24, 26, 28, 30 composed of patterned gate dielectric layer and patterned gate material layer are formed on the substrate 12.

Next, at least a spacer 36 is formed on the sidewalls of each of the gate structures 24, 26, 28, 30, a source region 38 composed of n+ region is formed in the first fin-shaped structure 14 adjacent to one side of the gate structure 24, and a drain region 40 composed of another n+ region is formed in the second fin-shaped structure 16 adjacent to another side of the gate structure 28. In this embodiment, the spacer 36 could be a single spacer or a composite spacer, such as a spacer including but not limited to for example an offset spacer and a main spacer. Preferably, the offset spacer and the main spacer could include same material or different material while both the offset spacer and the main spacer could be made of material including but not limited to for example $SiO_2$, SiN, SiON, SiCN, or combination thereof. The source region 38 and the drain region 40 could include n-type dopants or p-type dopants depending on the type of device being fabricated.

Next, an interlayer dielectric (ILD) layer (not shown) is formed on the gate structures 24, 26, 28, 30 and the STI 22, and a planarizing process such as chemical mechanical polishing (CMP) process is conducted to remove part of the ILD layer to expose the patterned gate material layer made of polysilicon so that the top surfaces of the ILD layer and the gate material layer are coplanar.

Next, a replacement metal gate (RMG) process is conducted to transform the gate structure made of polysilicon into metal gates 24, 26, 28, 30, in which the left portion 32 and right portion 34 of the gate structure 24 sitting on both the first fin-shaped structure 14 and the STI 22 preferably includes different work function values thereby achieving different threshold voltage and a boundary 42 between the p-well 18 and the n-well 20 is also substantially aligned with the boundary between the left portion 32 and the right portion 34.

In this embodiment, the formation of the metal gates could be accomplished by first performing a selective dry etching or wet etching process, such as using etchants including but not limited to for example ammonium hydroxide ($NH_4OH$) or tetramethylammonium hydroxide (TMAH) to remove the gate material layer or even gate dielectric layer from gate structures for forming recesses (not shown) in the ILD layer. Next, a selective interfacial layer or gate dielectric layer (not shown), a high-k dielectric layer 44, at least a work function metal layer, and a low resistance metal layer are formed in the recesses, and a planarizing process such as CMP is conducted to remove part of low resistance metal layer, part of work function metal layer, and part of high-k dielectric layer to form metal gates.

Figure 2:
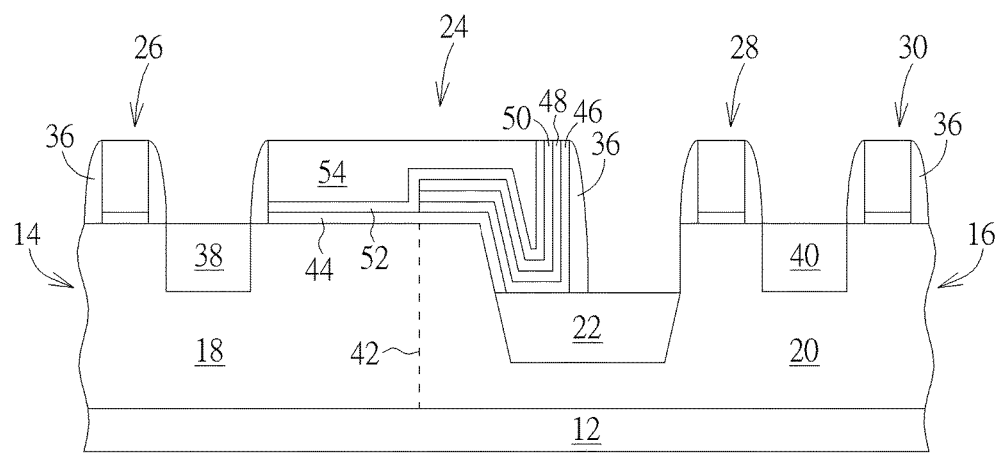
FIG. 2 illustrates a method for fabricating a LDMOS device according to an embodiment of the present invention.

Viewing from a much more detailed perspective, as shown in FIG. 2, the transformation from gate structures (or polysilicon dummy gates) into metal gates first deposits a high-k dielectric layer 44 into the recess, forms three layers of first work function metal layers 46, 48, 50 on the high-k dielectric layer 44 and the STI 22, conducts an etching process to remove part of the first work function metal layers 46, 48, 50 on the left portion of the recess or left side of the boundary 42, forms a second work function metal layer 52 on both left portion and right portion of the boundary 42, and then fill the recess with a low resistance metal layer 54.

It should be noted that even though this embodiment transforms all of the gate structures 24, 26, 28, 30 into metal gates at the same time, according to an embodiment of the present invention, it would also be desirable to cover the gate structures 26, 28, 30 with a mask during the RMG process so that only the gate structure 24 is transformed into metal gate while the gate structures 26, 28, 30 are remained to be polysilicon gates, which is also within the scope of the present invention.

In this embodiment, the high-k dielectric layer 44 is preferably selected from dielectric materials having dielectric constant (k value) larger than 4. For instance, the high-k dielectric layer 44 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

The first work function metal layers 46, 48, 50 and the second work function metal layer 52 are preferably work function metal layers having different conductive type. For instance, the first work function metal layers 46, 48, 50 in this embodiment are preferably p-type work function metal layers while the second work function metal layer 52 is a n-type work function metal layer. This enables or constitutes a high threshold voltage region in the right portion of the gate structure 24 while the left portion of the gate structure 24 pertains to be a low threshold voltage region. Nevertheless, according to an embodiment of the present invention, it would also be desirable to reverse the aforementioned process by using n-type work function metal layers for the first work function metal layers 46, 48, 50 and p-type work function metal layer for the second work function metal layer 52, which is also within the scope of the present invention.

In this embodiment, the n-type work function metal layers could include materials having a work function ranging between 3.9 eV and 4.3 eV, which may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but not limited thereto. P-type work function metal layers on the other hand could include materials having a work function ranging between 4.8 eV and 5.2 eV, which may include titanium nitride (TiN), tantalum nitride (TaN), tantalum carbide (TaC), but not limited thereto.

An optional barrier layer (not shown) could be formed between the second work function metal layer 52 and the low resistance metal layer 54, in which the material of the barrier layer may include titanium (Ti), titanium nitride (TiN), tantalum (Ta) or tantalum nitride (TaN). Furthermore, the material of the low-resistance metal layer 54 may include copper (Cu), aluminum (Al), titanium aluminum (TiAl), cobalt tungsten phosphide (CoWP) or any combination thereof. Next, contact plugs could be formed depending on the demand of the product to electrically connect to the source region 38 and the drain region 40. This completes the fabrication of a LDMOS device according to an embodiment of the present invention.

Referring to FIGS. 3-6, FIGS. 3-6 illustrate different embodiments of fabricating LDMOS devices by forming different layers of work function metal layers to achieve different threshold voltages.

Figure 3:
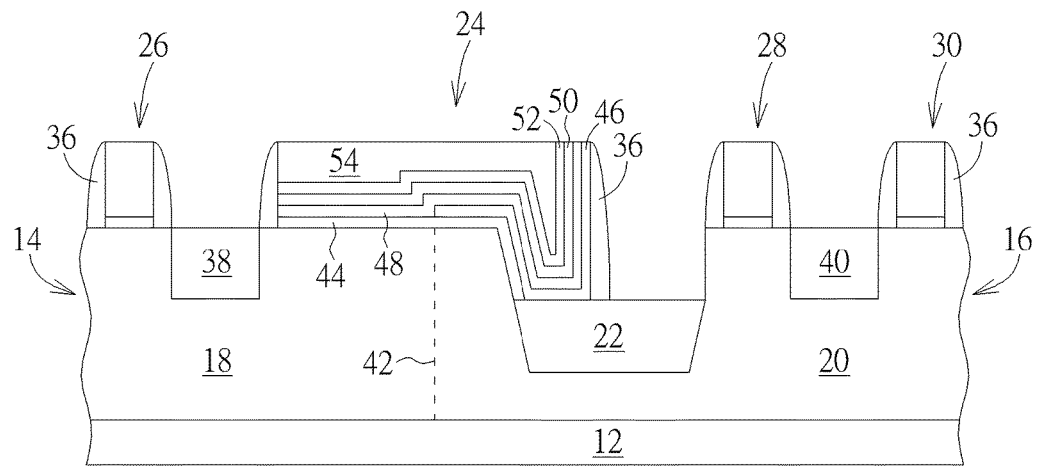
FIG. 3 illustrates a structural view of a LDMOS device according to an embodiment of the present invention.

As shown in FIG. 3, after removing the gate material layer to form a recess as disclosed in the aforementioned embodiment, it would be desirable to first deposit a high-k dielectric layer 44 in the recess, form a first work function metal layer 46 on the high-k dielectric layer 44 and the STI 22, remove the first work function metal layer 46 on the left side of the boundary 42, form two layers of first work function metal layers 48 and 50 in the recess on both left and right side of the boundary 42, form a second work function metal layer 52 on the first work function metal layer 50, and then form a low resistance metal layer 54 to fill the recess. Similar to the aforementioned embodiment, the first work function metal layers 46, 48, 50 preferably include p-type work function metal layers while the second work function metal layer 52 includes n-type work function metal layer. This forms a high threshold voltage region on the right portion of the gate structure 24 and a low threshold voltage region on the left portion.

Figure 4:
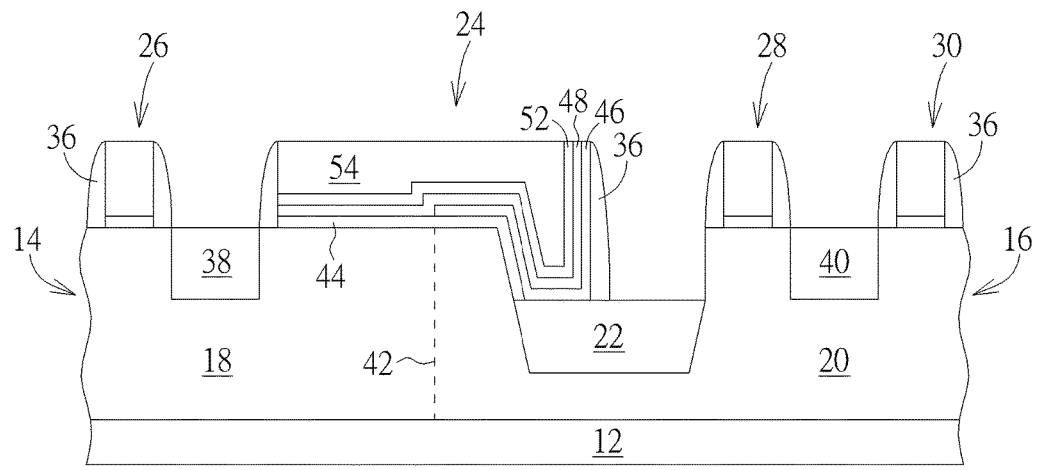
FIG. 4 illustrates a structural view of a LDMOS device according to an embodiment of the present invention.

Referring to FIG. 4, FIG. 4 illustrates a structural view of a LDMOS device according to an embodiment of the present invention. As shown in FIG. 4, after removing the gate material layer to form a recess as disclosed in the aforementioned embodiment, it would be desirable to first deposit a high-k dielectric layer 44 in the recess, form a first work function metal layer 46 on the high-k dielectric layer 44 and the STI 22, remove the first work function metal layer 46 on the left side of the boundary 42, form another first work function metal layer 48 in the recess on both left and right sides of the boundary 42, form a second work function metal layer 52 on the first work function metal layer 48, and then form a low resistance metal layer 54 to fill the recess. Similar to the aforementioned embodiment, the first work function metal layers 46, 48 preferably include p-type work function metal layers while the second work function metal layer 52 includes n-type work function metal layer. This forms a high threshold voltage region on the right portion of the gate structure 24 and a low threshold voltage region on the left portion.

Figure 5:
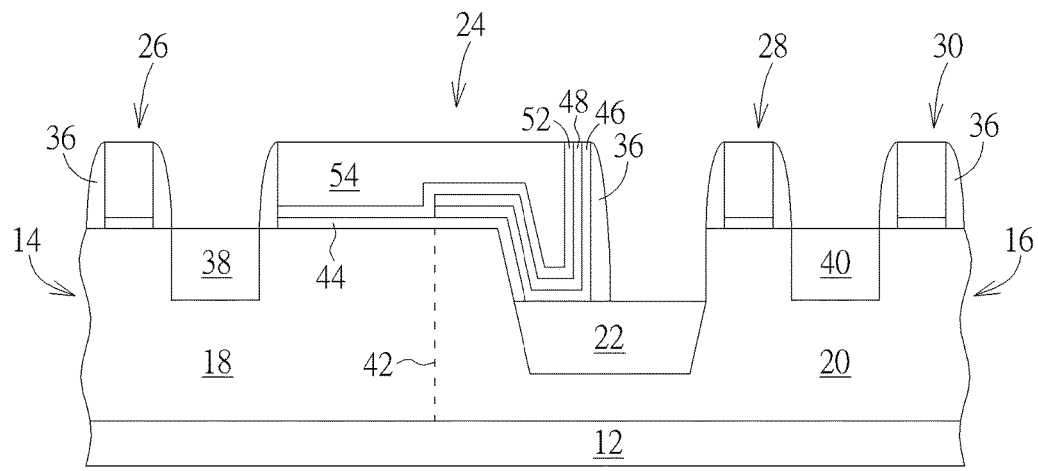
FIG. 5 illustrates a structural view of a LDMOS device according to an embodiment of the present invention.

Referring to FIG. 5, FIG. 5 illustrates a structural view of a LDMOS device according to an embodiment of the present invention. As shown in FIG. 5, after removing the gate material layer to form a recess as disclosed in the aforementioned embodiment, it would be desirable to first deposit a high-k dielectric layer 44 in the recess, form two layers of first work function metal layers 46 and 48 on the high-k dielectric layer 44 and the STI 22, remove the first work function metal layers 46 and 48 on the left side of the boundary 42, form a second work function metal layer 52 in the recess on both left and right sides of the boundary 42, and then form a low resistance metal layer 54 to fill the recess. Similar to the aforementioned embodiment, the first work function metal layers 46, 48 preferably include p-type work function metal layers while the second work function metal layer 52 includes n-type work function metal layer. This forms a high threshold voltage region on the right portion of the gate structure 24 and a low threshold voltage region on the left portion.

Figure 6:
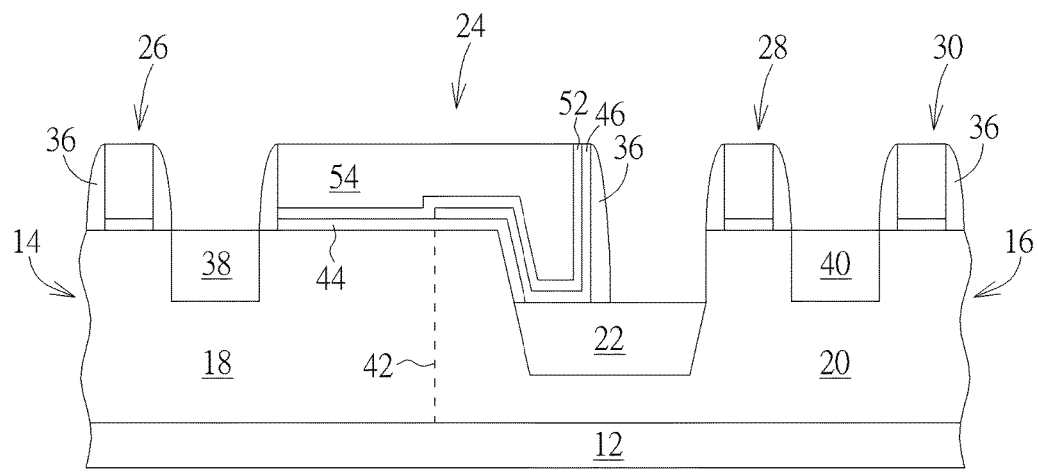
FIG. 6 illustrates a structural view of a LDMOS device according to an embodiment of the present invention.

Referring to FIG. 6, FIG. 6 illustrates a structural view of a LDMOS device according to an embodiment of the present invention. As shown in FIG. 6, after removing the gate material layer to form a recess as disclosed in the aforementioned embodiment, it would be desirable to first deposit a high-k dielectric layer 44 in the recess, form a single layer of first work function metal layer 46 on the high-k dielectric layer 44 and the STI 22, remove the first work function metal layer 46 on the left side of the boundary 42, form a second work function metal layer 52 in the recess on both left and right sides of the boundary 42, and then form a low resistance metal layer 54 to fill the recess. Similar to the aforementioned embodiment, the first work function metal layer 46 preferably includes a p-type work function metal layer while the second work function metal layer 52 includes a n-type work function metal layer. This forms a high threshold voltage region on the right portion of the gate structure 24 and a low threshold voltage region on the left portion.

Figure 7:
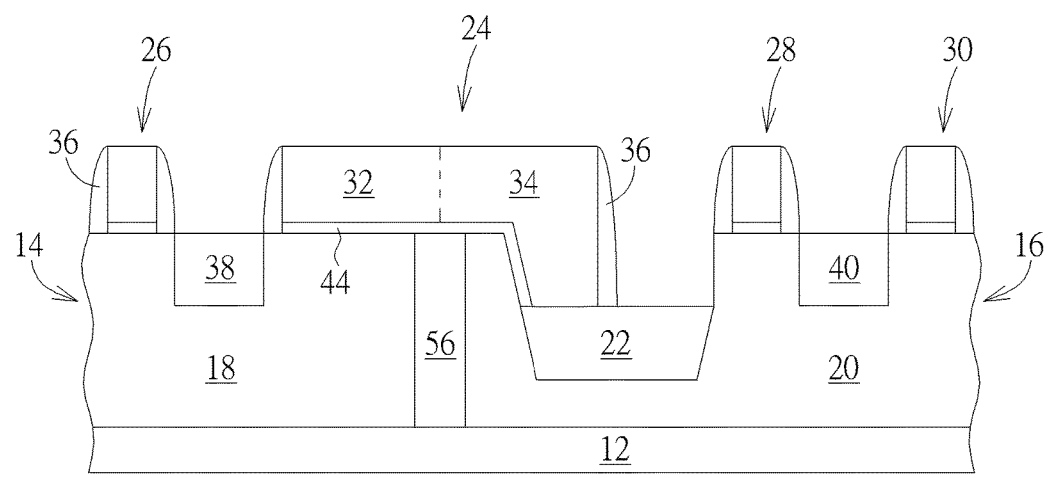
FIG. 7 illustrates a structural view of a LDMOS device according to an embodiment of the present invention.

Referring to FIG. 7, FIG. 7 illustrates a structural view of a LDMOS device according to an embodiment of the present invention. As shown in FIG. 7, it would be desirable to form an undoped region 56 or intrinsic region between the p-well 18 and the n-well 20 to serve as a buffer between the two well regions. As shown in FIG. 7, even though both the left portion 32 and right portion 34 of the gate structure 24 are disposed on or overlapping the undoped region 56 at the same time, according to an embodiment of the present invention, it would also be desirable to shift the position of the undoped region 56 by disposing the undoped region 56 only under the left portion 32 of the gate structure 24 without extending to the right portion 34 or disposing the undoped region 56 only under the right portion 34 without not extending to the left portion 32, which are all within the scope of the present invention.

Figure 8:
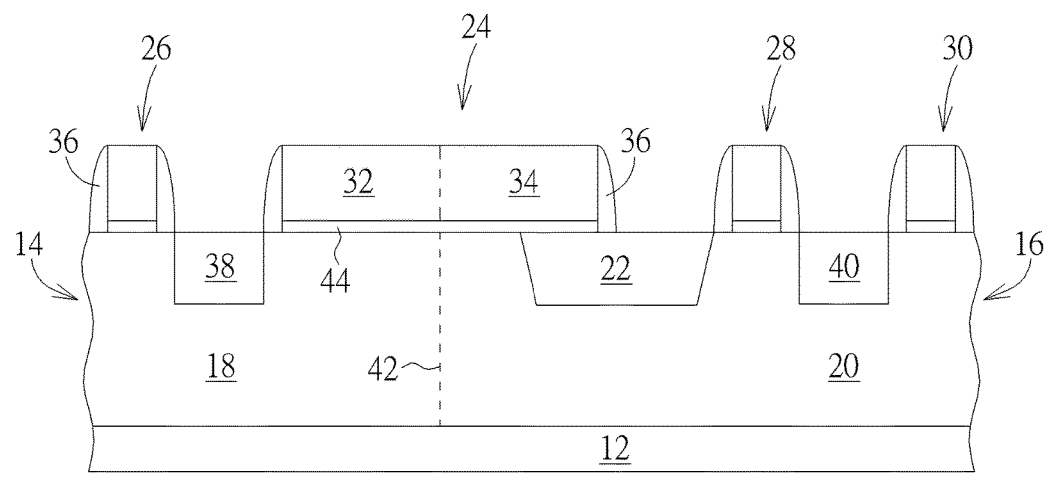
FIG. 8 illustrates a structural view of a LDMOS device according to an embodiment of the present invention.

Referring to FIG. 8, FIG. 8 illustrates a structural view of a LDMOS device according to an embodiment of the present invention. As shown in FIG. 8, in contrast to integrating the LDMOS device on the fin-shaped structures, according to an embodiment of the present invention, it would also be desirable to dispose the LDMOS directly on the substrate 12 to form a planar semiconductor device. Hence, even though the gate structure 24 in this embodiment is also disposed on the substrate 12 and STI 22 at the same time, the bottom of the gate structure 24 sitting on the STI 22 is preferably even with the bottom of the gate structure 24 on the substrate 12.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
    forming a first fin-shaped structure on a substrate;
    forming a shallow trench isolation (STI) adjacent to the first fin-shaped structure; and
    forming a gate structure on the first fin-shaped structure and the STI, wherein the gate structure comprises a left portion and the right portion and the work functions in the left portion and the right portion are different.

2. The method of claim 1, further comprising forming a second fin-shaped structure adjacent to the first fin-shaped structure, wherein the STI is between the first fin-shaped structure and the second fin-shaped structure.

3. The method of claim 2, further comprising forming a source region adjacent to one side of the gate structure in the first fin-shaped structure and a drain region in the second fin-shaped structure.

4. The method of claim 1, further comprising a first well adjacent to one side of the gate structure and a second well adjacent to another side of the gate structure.

5. The method of claim 4, wherein the first well and the second well comprise different conductive type.

6. The method of claim 4, wherein a boundary between the first well and the second well is aligned with a boundary between the left portion and the right portion of the gate structure.

7. The method of claim 1, further comprising forming a first spacer adjacent to the left portion on the first fin-shaped structure.

8. The method of claim 1, further comprising forming a second spacer adjacent to the right portion on the STI.

9. A semiconductor device, comprising:
    a first fin-shaped structure on a substrate;
    a shallow trench isolation (STI) adjacent to the first fin-shaped structure; and
    a gate structure on the first fin-shaped structure and the STI, wherein the gate structure comprises a left portion and the right portion and the work functions in the left portion and the right portion are different.

10. The semiconductor device of claim 9, further comprising a second fin-shaped structure adjacent to the first fin-shaped structure, wherein the STI is between the first fin-shaped structure and the second fin-shaped structure.

11. The semiconductor device of claim 10, further comprising a source region adjacent to one side of the gate structure in the first fin-shaped structure and a drain region in the second fin-shaped structure.

12. The semiconductor device of claim 9, further comprising a first well adjacent to one side of the gate structure and a second well adjacent to another side of the gate structure.

13. The semiconductor device of claim 12, wherein the first well and the second well comprise different conductive type.

14. The semiconductor device of claim 12, wherein a boundary between the first well and the second well is aligned with a boundary between the left portion and the right portion of the gate structure.

15. The semiconductor device of claim 9, further comprising a first spacer adjacent to the left portion on the first fin-shaped structure.

16. The semiconductor device of claim 9, further comprising a second spacer adjacent to the right portion on the STI.

* * * * *